(12) United States Patent
Qian et al.

(10) Patent No.: US 9,129,001 B2
(45) Date of Patent: Sep. 8, 2015

(54) CHARACTER DATA COMPRESSION FOR REDUCING STORAGE REQUIREMENTS IN A DATABASE SYSTEM

(75) Inventors: Xu-dong Qian, Shanghai (CN); ZhiPing Xiong, Shanghai (CN)

(73) Assignee: Sybase, Inc., Dublin, CA (US)

( * ) Notice: Subject to any disclaimer, the term of this patent is extended or adjusted under 35 U.S.C. 154(b) by 0 days.

(21) Appl. No.: 13/465,482

(22) Filed: May 7, 2012

(65) Prior Publication Data

US 2013/0297573 A1 Nov. 7, 2013

(51) Int. Cl.
*G06F 7/00* (2006.01)
*G06F 17/00* (2006.01)
*G06F 17/30* (2006.01)
*H03M 7/30* (2006.01)
*H03M 7/46* (2006.01)

(52) U.S. Cl.
CPC .... *G06F 17/30595* (2013.01); *G06F 17/30153* (2013.01); *H03M 7/30* (2013.01); *H03M 7/46* (2013.01)

(58) Field of Classification Search
CPC .................................................. G06F 17/30153
See application file for complete search history.

(56) References Cited

U.S. PATENT DOCUMENTS

| | | | | |
|---|---|---|---|---|
| 6,750,875 B1* | 6/2004 | Keely et al. | ................... | 345/613 |
| 7,961,959 B2* | 6/2011 | Bashyam et al. | ............. | 382/232 |
| 8,671,357 B2* | 3/2014 | Spetalnick | .................... | 715/773 |
| 2004/0075596 A1* | 4/2004 | Price | ............................... | 341/65 |
| 2006/0155539 A1* | 7/2006 | Chen et al. | .................... | 704/251 |
| 2008/0034268 A1* | 2/2008 | Dodd et al. | .................... | 714/755 |
| 2009/0018683 A1* | 1/2009 | Gibbs et al. | ..................... | 700/94 |
| 2009/0060047 A1* | 3/2009 | Schneider | ................ | 375/240.23 |
| 2010/0131476 A1* | 5/2010 | Kataoka et al. | ............... | 707/693 |
| 2011/0208833 A1* | 8/2011 | Fallon | ............................ | 709/217 |
| 2012/0203755 A1* | 8/2012 | Biran et al. | ................... | 707/706 |

* cited by examiner

*Primary Examiner* — Loan T Nguyen
(74) *Attorney, Agent, or Firm* — Sterne, Kessler, Goldstein & Fox P.L.L.C.

(57) ABSTRACT

A system, method, and computer program product for character data compression for reducing data storage requirements in a database system are described. Embodiments include identifying data of a particular character type in a full data page, and identifying usage frequency of each character of the particular character type. Each character is encoded based on the identified usage frequency and stored, with storage requirements for most frequently used characters are reduced.

16 Claims, 4 Drawing Sheets

CHARACTER DATA COMPRESSION FOR REDUCING STORAGE REQUIREMENTS IN A DATABASE SYSTEM

FIELD OF THE INVENTION

The present invention relates generally to database systems and, more particularly, to character data compression in database systems.

BACKGROUND OF THE INVENTION

Computers are very powerful tools for storing and providing access to vast amounts of information. Relational databases are a common mechanism for storing information on computer systems while providing easy access to users. A typical relational database is an organized collection of related information stored as "records" having "fields" of information. As an example, a database of employees may have a record for each employee where each record contains fields designating specifics about the employee, such as name, home address, salary, and the like.

Between the actual physical database itself (i.e., the data actually stored on a storage device) and the users of the system, a relational database management system or RDBMS is typically provided as a software cushion or layer. In essence, the RDBMS shields the database user from knowing or even caring about the underlying hardware-level details. Typically, all requests from users for access to the data are processed by the RDBMS. For example, information may be added or removed from data files, information retrieved from or updated in such files, and so forth, all without user knowledge of the underlying system implementation. In this manner, the RDBMS provides users with a conceptual view of the database that is removed from the hardware level. The general construction and operation of database management systems is well known in the art. See e.g., Date, C., "An Introduction to Database Systems, Seventh Edition", Part I (especially Chapters 1-4), Addison Wesley, 2000.

A key challenge faced by relational database systems is the ever-growing database size. With increasing use of digital devices and ease of data flow on ubiquitous networks, the data explosion has accelerated in recent years. As regular database and table size has grown tremendously in recent years, data compression becomes increasing important even for databases. While row level compression and page level compression for databases have been introduced, a need remains for improved compression techniques to overcome deficiencies in these approaches without causing significant increases in overhead. The present invention addresses this need.

SUMMARY OF THE INVENTION

The invention includes methods, systems, and computer program products for character data compression for reducing data storage requirements in a database system.

Embodiments include identifying data of a particular character type in a full data page, and identifying usage frequency of each character of the particular character type. Each character is encoded based on the identified usage frequency, and the encoded data is stored, with storage requirements reduced for the most frequently used characters.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the relevant art to make and use the invention.

FIG. 2 depicts an ASCII data chart.

Figure 1:
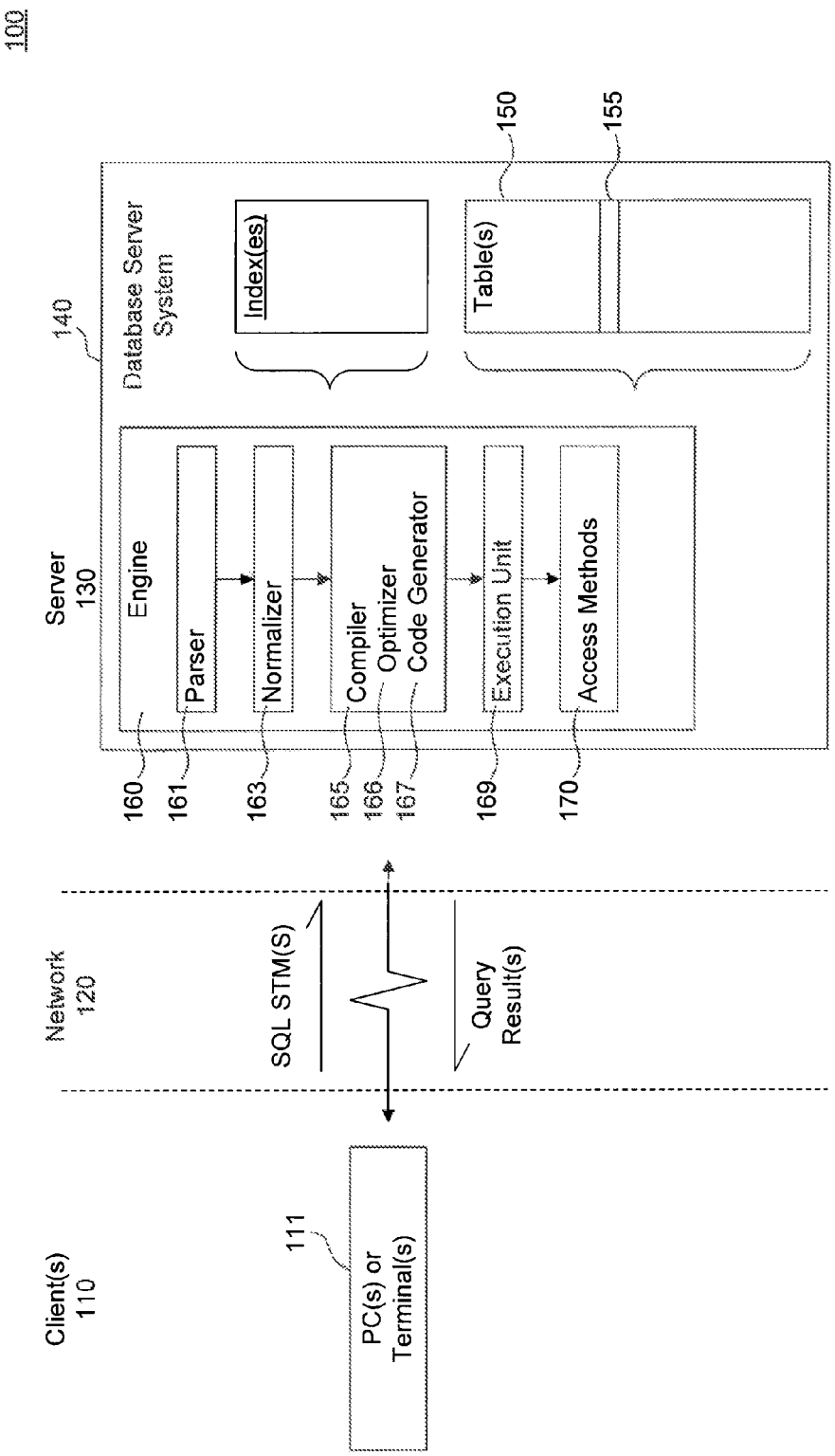
FIG. 1 illustrates the general structure of a client/server database system suitable for implementing the present invention.

The features and advantages of the present invention will become more apparent from the detailed description set forth below when taken in conjunction with the drawings. In the drawings, like reference numbers generally indicate identical, functionally similar, and/or structurally similar elements. Generally, the drawing in which an element first appears is indicated by the leftmost digit(s) in the corresponding reference number.

DETAILED DESCRIPTION

The present invention relates to system, method, computer program product embodiments and combinations and subcombinations thereof for character data compression in a database system.

FIG. 1 illustrates the general structure of a client/server database system 100 suitable for implementing the present invention. (Specific modifications to the system 100 for implementing methodologies of the present invention are described in subsequent sections below). As shown, the system 100 comprises one or more client(s) 110 connected to a server 130 via a network 120. Specifically, the client(s) 110 comprise one or more standalone terminals 111 connected to a database server system 140 using a conventional network. In an exemplary embodiment, the terminals 111 may themselves comprise a plurality of standalone workstations, dumb terminals, or the like, or comprise personal computers (PCs). Typically, such units would operate under a client operating system, such as a Microsoft® Windows client operating system (e.g., Microsoft® Windows 95/98, Windows 2000, or Windows XP).

The database server system 140, which comprises Sybase® Adaptive Server® Enterprise (ASE) (available from Sybase, Inc. of Dublin, Calif.) in an exemplary embodiment, generally operates as an independent process (i.e., independently of the clients), running under a server operating system such as Microsoft® Windows NT, Windows 2000, or Windows XP (all from Microsoft Corporation of Redmond, Wash.), UNIX (Novell), Solaris (Sun), or Linux (Red Hat). The network 120 may be any one of a number of conventional network systems, including a Local Area Network (LAN) or Wide Area Network (WAN), as is known in the art (e.g., using Ethernet, IBM Token Ring, or the like). The network 120 includes functionality for packaging client calls in the well-known Structured Query Language (SQL) together with any parameter information into a format (of one or more packets) suitable for transmission to the database server system 140. The described computer hardware and software are presented for purposes of illustrating the basic underlying desktop and server computer components that may be employed for implementing the present invention, including, for example, an environment having multiple server instances (e.g., database server nodes) in a cluster that communicate with one or more "clients" (e.g., personal computers or mobile devices). The present invention, however, is not limited to any particular environment or device configuration. Instead, the present invention may be implemented in any type of system architecture or processing environment capable of supporting the methodologies of the present invention presented in detail below.

Client/server environments, database servers, and networks are well documented in the technical, trade, and patent literature. In operation, the client(s) 110 store data in, or retrieve data from, one or more database tables 150, as shown at FIG. 1. Data in a relational database is stored as a series of tables, also called relations. Typically resident on the server 130, each table itself comprises one or more "rows" or "records" (tuples) (e.g., row 155 as shown at FIG. 1). A typical database will contain many tables, each of which stores information about a particular type of entity. A table in a typical relational database may contain anywhere from a few rows to millions of rows. A row is divided into fields or columns; each field represents one particular attribute of the given row. A row corresponding to an employee record, for example, may include information about the employees ID Number, Last Name and First Initial, Position, Date Hired, Social Security Number (SSN), and Salary. Each of these categories, in turn, represents a database field. In the foregoing employee table, for example, Position is one field, Date Hired is another, and so on. With this format, tables are easy for users to understand and use. Moreover, the flexibility of tables permits a user to define relationships between various items of data, as needed. Thus, a typical record includes several categories of information about an individual person, place, or thing. Each row in a table is uniquely identified by a record ID (RID), which can be used as a pointer to a given row.

Most relational databases implement a variant of the Structured Query Language (SQL), which is a language allowing users and administrators to create, manipulate, and access data stored in the database. The syntax of SQL is well documented; see, e.g., the above-mentioned "An Introduction to Database Systems". SQL statements may be divided into two categories: data manipulation language (DML), used to read and write data; and data definition language (DDL), used to describe data and maintain the database. DML statements are also called queries. In operation, for example, the clients 110 issue one or more SQL commands to the server 130. SQL commands may specify, for instance, a query for retrieving particular data (i.e., data records meeting the query condition) from the database table(s) 150. In addition to retrieving the data from database server table(s) 150, the clients 110 also have the ability to issue commands to insert new rows of data records into the table(s), or to update and/or delete existing records in the table(s).

SQL statements or simply "queries" must be parsed to determine an access plan (also known as "execution plan" or "query plan") to satisfy a given query. In operation, the SQL statements received from the client(s) 110 (via network 120) are processed by the engine 160 of the database server system 140. The engine 160 itself comprises a parser 161, a normalizer 163, a compiler 165, an execution unit 169, and an access method 170. Specifically, the SQL statements are passed to the parser 161 which employs conventional parsing methodology (e.g., recursive descent parsing). The parsed query is then normalized by the normalizer 163. Normalization includes, for example, the elimination of redundant data. Additionally, the normalizer 163 performs error checking, such as confirming that table names and column names which appear in the query are valid (e.g., are available and belong together). Finally, the normalizer 163 can also look-up any referential integrity constraints which exist and add those to the query.

After normalization, the query is passed to the compiler 165, which includes an optimizer 166 and a code generator 167. The optimizer 166 performs a cost-based analysis for formulating a query execution plan that is reasonably close to an optimal plan. The code generator 167 translates the query execution plan selected by the query optimizer 166 into executable form for execution by the execution unit 169 using the access methods 170.

All data in a typical relational database system is stored in pages on a secondary storage device, usually a hard disk. Typically, these pages may range in size from 1 Kb to 32 Kb, with the most common page sizes being 2 Kb and 4 Kb. All input/output operations (I/O) against secondary storage are done in page-sized units—that is, the entire page is read/written at once. Pages are also allocated for one purpose at a time: a database page may be used to store table data or used for virtual memory, but it will not be used for both. The memory in which pages that have been read from disk reside is called the cache or buffer pool.

I/O to and from the disk tends to be the most costly operation in executing a query. This is due to the latency associated with the physical media, in comparison with the relatively low latency of main memory (e.g., RAM). Query performance can thus be increased by reducing the number of I/O operations that must be completed.

The present invention improves I/O performance for more efficient query processing and database operation by utilizing compression techniques that reduce data storage requirements. As will be described in further detail herein below, embodiments of the present invention address character compression of a full data page.

As is well-known, one of the most frequently used datatypes in RDBMS is character. For example, when a table is defined to store a person's private information, it may include information such as Name, Address, Hobby, which are all character datatype. Having a good way to compress character datatype saves storage space.

Figure 2:
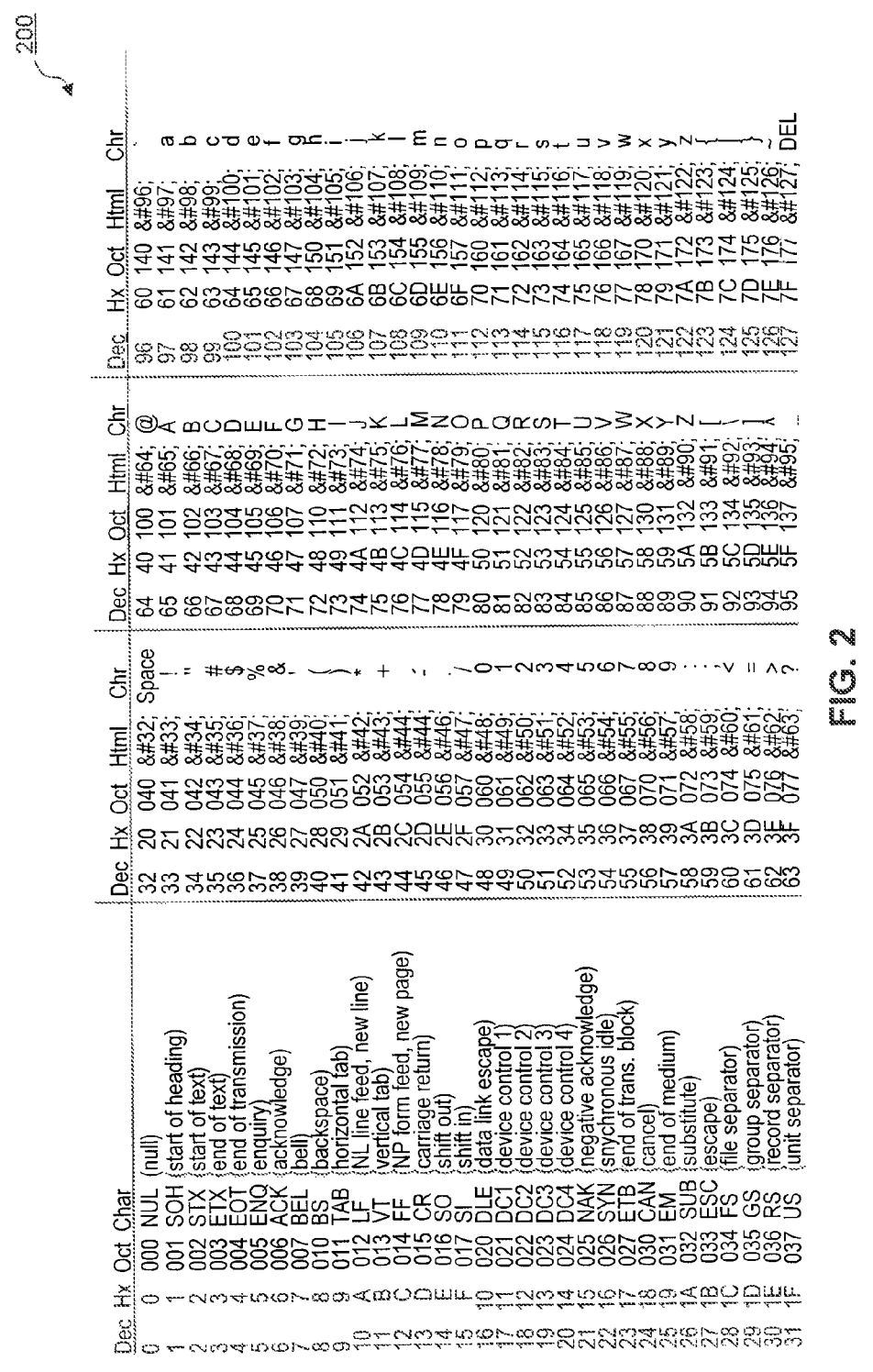

While there are several known character sets, e.g., ASCII, UTF-8, GB2312 etc., for purposes of the present invention, focus is given to the ASCII character set, a representation of which is shown in the chart 200 of FIG. 2. With respect to compression of ASCII character data, while some encoding algorithms are known, e.g., Huffman coding, the complicated nature of such schemes would significantly and negatively impact runtime performance, making them less than desired to employ in an RDBMS.

Figure 3:
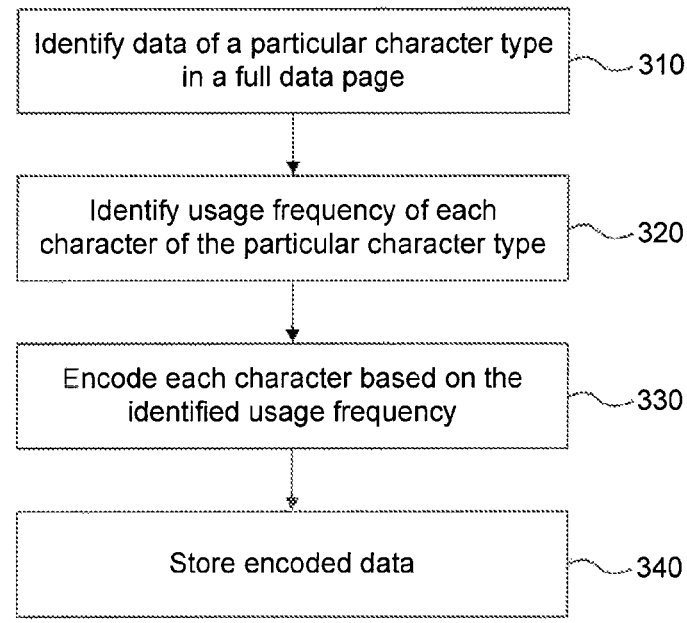
FIG. 3 illustrates an overall flow diagram for character data compression for reducing data storage requirements in a database system in accordance with an embodiment of the present invention.

Referring now to FIG. 3, an overall flow diagram is presented for reducing data storage requirements in a database system through character data encoding in accordance with an embodiment of the present invention. The process includes identifying data of a particular character type in a full data page (block 310) and identifying usage frequency of each character of the particular character type (block 320). By way of example, when a datapage is full, all character data from columns capable of having data of the particular character type is collected, and in a preferred embodiment, the top 9 characters in this datapage are determined. For example: in a datapage 'P1', suppose it has character counts of 900 'a', 540 'b', 300 'c', 200 'd', 134 'e', 213 'f', 400 'g', 300 'h', 200 'i', 100 'j', 800 'k', 142 'l', 422 'm', 321 'n', 213 'o', 532 'p'. The top 9 characters for such a datapage would be the 900 'a', 800 'k', 540 'b', 532 'p', 422 'm', 400 'g', 321 'n', 300 'c', 300 'h'.

Encoding of each character follows based on the identified usage frequency (block 330), and the encoded characters are stored (block 340). As is demonstrated by the following description, the storage requirements for most frequently used characters is reduced through the approach of the present invention.

By way of example, suppose a column has character data of "david123" that is to be encoded. Using a looping approach, first is encoded, then 'a' is encoded, then 'v' is encoded, etc., with '3' being the last character to be encoded. If the character being encoded is one of the top 9 characters identified for the datapage, its encoding is done using 4 bits. Preferably, the encoded data for the top nine characters is grouped as a mapping stream and saved in the datapage. Using the previous example, with the top 9 characters being the 900 'a', 800 'k', 540 'b', 532 'p', 422 'm', 400 'g', 321 'n', 300 'c', 300 'h', then:

'a' is encoded into 0000
'k' is encoded into 0001
'b' is encoded into 0010
'p' is encoded into 0011
'm' is encoded into 0100
'g' is encoded into 0101
'n' is encoded into 0110
'c' is encoded into 0111
'h' is encoded into 1000.

If the character being encoded is not one of the top 9 characters, a check is made as to whether its ASCII value is in the range 32-127 or not, 32-127 referring to the Dec (decimal) values shown in chart 200 for the ASCII characters and known to be those characters that are used generally more frequently in character datatype data than ASCII characters in the range 0-31. If the character being encoded is in the range of 32-127, then it is encoded into 8 bits, with the first four bits of this 8 bits ranging from 1001-1110. This range is chosen based on the fact that 10010000-1.1101111 has 96 different values, capably allowing a one-to-one mapping with the 96 values of the range 32-127. In this manner, the encoding of a character is generated in a straightforward manner by adding the Dec value of the character to 112. For example, to encode a character 'd' for the aforementioned datapage, since it is not in the top 9 characters in the datapage, but its ASCII value is in the range 32-127, it is encoded into 8 bits. With the ASCII Dec value of being 100, its encoded value is 100+112=212 (i.e., 11010100).

If the character being encoded is not one of the most frequently used on the datapage and does not have an ASCII value in the range 32-127, then it is encoded into 12 bits, where the first four bits of this 12 bits are always 1111, with the subsequent eight bits containing the actual ASCII value in Hexadecimal of the character (shown in chart 200 as the Hx values). For example, if the character 'VT' (vertical tab) requires encoding, it is not in the top 9 characters in the aforementioned datapage, and its ASCII value is not in the range 32-127, so it is encoded into 12 bits. With the Hx ASCII value of 'VT' shown in the chart 200 as being B (i.e., commonly represented as 0x0b), its encoded value is 1111 0000 1011 (i.e., 0xf0b, with the first 4 bits acting as a mark and a value that is always 0xf). In this manner, based on the coding approach of the present invention, the most frequently used 9 characters require half the number of bits as that needed to encode the most frequently used characters of the ASCII character set, and one-third the number of bits of the remaining characters of the ASCII character set.

As will be well-appreciated by those skilled in the art, the decoding is the reverse of the encoding. Thus, the first four bits are checked, and if they are in the range 0000-1000, then the character being decoded is one of the top 9 characters. Since every datapage has a mapping for these values, the character is decoded into its original ASCII value according to the mapping. If the first four bits are in the value range 1001-1110, then the decoded value is the encoded value minus 112. If value of the first four bits is 1111, then the decoded value is the actual ASCII value that follows in the next 8 bits.

In this manner, the present invention provides a straightforward and efficient approach to achieve a good compression ratio with minor impact to runtime performance, given its small encoding and decoding overhead. For example, testing using the approach of the present invention has shown a space savings average of approximately 10% across a database with substantially no noticeable degradation of performance.

Figure 4:
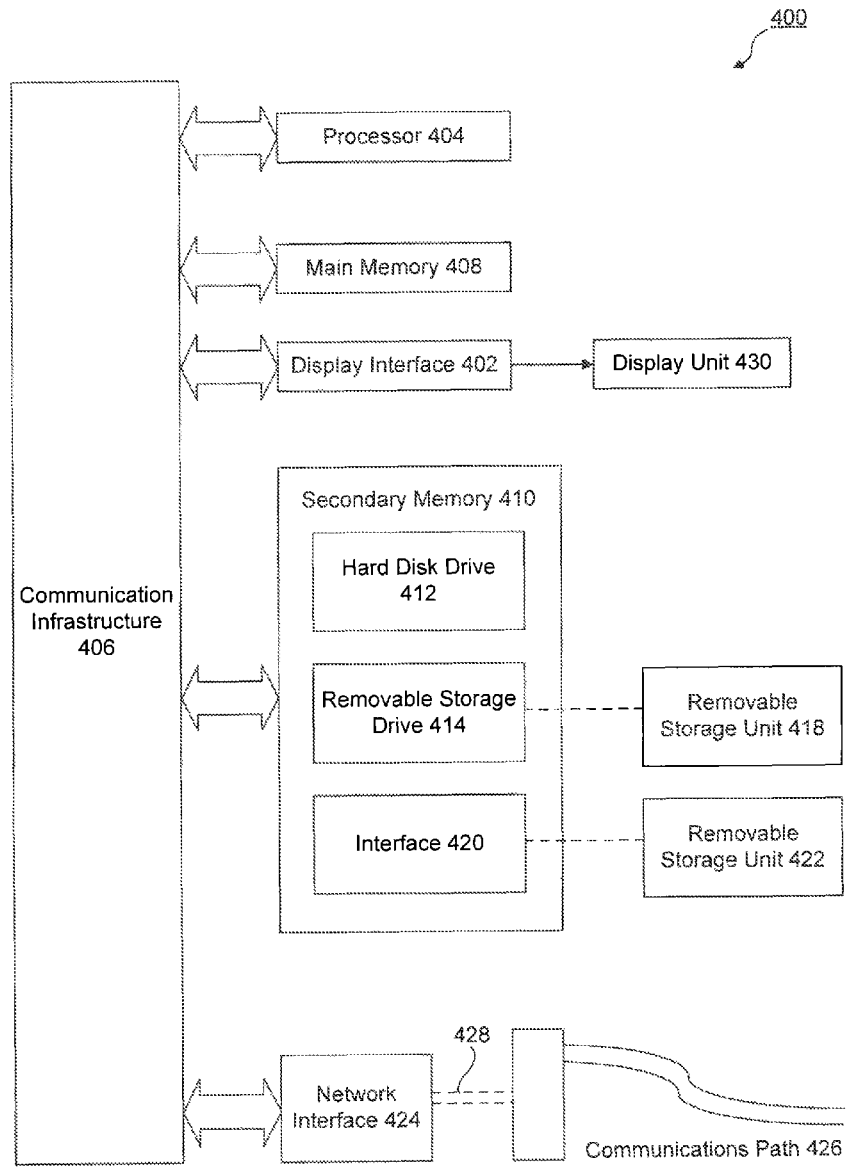
FIG. 4 illustrates an example computer system useful for implementing components of embodiments of the invention.

FIG. 4 illustrates an example computer system 400 in which the present invention, or portions thereof, can be implemented as computer-readable code. For example, the method illustrated by FIG. 3, can be implemented in system 400. Various embodiments of the invention are described in terms of this example computer system 400. After reading this description, it will become apparent to a person skilled in the relevant art how to implement the invention using other computer systems and/or computer architectures.

Computer system 400 includes one or more processors, such as processor 404. Processor 404 can be a special purpose or a general purpose processor. Processor 404 is connected to a communication infrastructure 406 (for example, a bus or network).

Computer system 400 also includes a main memory 408, preferably random access memory (RAM), and may also include a secondary memory 410. Secondary memory 410 may include, for example, a hard disk drive 412, a removable storage drive 414, and/or a memory stick. Removable storage drive 414 may comprise a floppy disk drive, a magnetic tape drive, an optical disk drive, a flash memory, or the like. The removable storage drive 414 reads from and/or writes to a removable storage unit 418 in a well known manner. Removable storage unit 418 may comprise a floppy disk, magnetic tape, optical disk, etc. Which is read by and written to by removable storage drive 414. As will be appreciated by persons skilled in the relevant art(s), removable storage unit 418 includes a computer usable storage medium having stored therein computer software and/or data.

In alternative implementations, secondary memory 410 may include other similar means for allowing computer programs or other instructions to be loaded into computer system 400. Such means may include, for example, a removable storage unit 422 and an interface 420. Examples of such means may include a program cartridge and cartridge interface (such as that found in video game devices), a removable memory chip (such as an EPROM; or PROM) and associated socket, and other removable storage units 422 and interfaces 420 which allow software and data to be transferred from the removable storage unit 422 to computer system 400.

Computer system 500 also includes input/output/display devices 530, such as monitors, keyboards, pointing devices, etc., which communicate with communication infrastructure 506 through a display interface 502.

Computer system 400 may also include a communications interface 424. Communications interface 424 allows software and data to be transferred between computer system 400 and external devices. Communications interface 424 may include a modem, a network interface (such as an Ethernet card), a communications port, a PCMCIA slot and card, or the like. Software and data transferred via communications interface 424 are in the form of signals 428, which may be electronic, electromagnetic, optical, or other signals capable of being received by communications interface 424. These signals are provided to communications interface 424 via a communications path 426. Communications path 426 carries signals and may be implemented using wire or cable, fiber optics, a phone line, a cellular phone link, an RF link or other communications channels.

In this document, the terms "computer program medium," "computer usable medium" and "computer readable medium" are used to generally refer to media such as removable storage unit 418, removable storage unit 422, and a hard disk installed in hard disk drive 412. Signals 428 carried over communications path 426 can also embody the logic described herein. Computer program medium and computer usable medium can also refer to memories, such as main memory 408 and secondary memory 410, which can be memory semiconductors (e.g. DRAMs, etc.). These computer program products are means for providing software to computer system 400.

Computer programs (also called computer control logic are stored in main memory 408 and/or secondary memory 410. Computer programs may also be received via communications interface 424. Such computer programs, when executed, enable computer system 400 to implement embodiments of the present invention as discussed herein. In particular, the computer programs, when executed, enable processor 404 to implement the processes of embodiments of the present invention, such as the method illustrated by FIG. 3. Accordingly, such computer programs represent controllers of the computer system 400. Where the invention is implemented using software, the software may be stored in a computer program product and loaded into computer system 400 using removable storage drive 414, interface 420, hard drive 412 or communications interface 424.

The invention is also directed to computer program products comprising software stored on any computer useable medium. Such software, when executed in one or more data processing device, causes a data processing device(s) to operate as described herein. Embodiments of the invention employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. It should be understood that the invention is not limited to these examples. The invention is applicable to any elements operating as described herein. Embodiments of the invention are applicable and can be used with other user interface development platforms and languages operating similarly, now existing or developed in the future. Further used herein, in an embodiment, the term "server" may be implemented as collection of servers such as a server farm or server cluster. For example, a database server may be a commercially available server machine with one or more central processing units (CPUs). Alternatively, a database server may comprise multiple computing devices and/or computing functionality hosted on multiple server machines (e.g., a server farm).

Accordingly, the breadth and scope of the present invention should not be limited by any of the above-described exemplary embodiments, but should be defined only in accordance with the following claims and their equivalents.

What is claimed is:

1. A method comprising:
    determining a usage frequency of each character of a collection of characters in a full data page;
    grouping a first subset of characters of the collection of characters, the first subset of characters representing most frequently used characters of the collection of characters in the full data page;
    grouping a second subset of characters of the collection of characters, based on a determination that a value associated with each character of the second subset of characters is within a range of character type values;
    grouping remaining characters of the collection of characters into a third subset of characters;
    encoding the first subset of characters, the second subset of characters, and the third subset of characters, such that (i) the first subset of characters is mapped to a first range of n bits, (ii) the second subset of characters is mapped to a second range of bits twice the size of the first range of n bits and based on aggregating the value associated with each character of the second subset of characters with a predetermined value, the predetermined value selected based on the n bits of an ending value of the second range of bits, and (iii) the third subset of characters is mapped to a third range of bits three times the size of the first range of bits; and
    storing the first, second, and third subset of encoded characters.

2. The method of claim 1, wherein each character of the collection of characters is an American Standard Code for Information Interchange (ASCII) character type.

3. The method of claim 1, wherein the determining a usage frequency further comprises collecting all character data from columns with data of a particular character type.

4. The method of claim 3, further comprising identifying a predetermined number of most frequently used characters in the collected character data.

5. The method of claim 4, wherein the predetermined number is nine and the number of bits is four.

6. The method of claim 1, further including encoding each character of the first subset with one-third a number of bits used to encode each character of a particular character type in the third subset.

7. A system configured to reduce database data storage requirements in a relational database through character data encoding, comprising:
    a computing device comprising a processor and memory;
    a storage module, implemented on the computing device and configured to store database data; and
    a processing module, implemented on the computing device and coupled to the storage module, the processing module configured to:
    determine a usage frequency of each character of a collection of characters in a full data page, group a first subset of characters of the collection of characters, the first subset of characters representing most frequently used characters of the collection of characters in the full data page, group a second subset of characters of the collection of characters, based on a determination that a value associated with each character of the second subset of characters is within a range of character type values, group remaining characters of the collection of characters into a third subset of characters, and encode the first subset of characters, the second subset of characters, and the third subset of characters, such that (i) the first subset of characters is mapped to a first range of n bits, (ii) the second subset of characters is mapped to a second range of bits twice the size of the first range of n bits, and based on aggregating the value associated with each character of the second subset of characters with a predetermined value, the predetermined value selected based on the n bits of an ending value of the second range of bits, and (iii) the third subset of characters is mapped to a third range of bits three times the size of the first range of bits, and store the first, second, and third subset of encoded characters in the storage module.

8. The system of claim 7, wherein each character of the collection of characters is an American Standard Code for Information Interchange (ASCII) character type.

9. The system of claim 7, wherein to determine usage frequency, the processing module is configured to collect all character data from columns with data of a particular character type.

10. The system of claim 9, wherein the processing module is further configured to identify a predetermined number of most frequently used characters in the collected character data.

11. The system of claim 7, wherein the processing module is further configured to encode each character of the first subset of characters with one-third a number of bits used to encode each character of the third subset of characters.

12. The system of claim 11 wherein the predetermined number is nine and the number of bits is four.

13. A computer-readable storage device having instructions stored thereon, that when executed by the computing device, cause the computing device to perform operations, comprising:

determining a usage frequency of each character of a collection of characters in a full data page;

grouping a first subset of characters of the collection of characters, the first subset of characters representing most frequently used characters of the collection of characters in the full data page;

grouping a second subset of characters of the collection of characters, based on a determination that a value associated with each character of the second subset of characters is within a range of character type values;

grouping remaining characters of the collection of characters into a third subset of characters;

encoding the first subset of characters, the second subset of characters, and the third subset of characters, such that (i) the first subset of characters is mapped to a first range of n bits. (ii) the second subset of characters is mapped to a second range of bits twice the size of the first range of n bits and based on aggregating the value associated with each character of the second subset of characters with a predetermined value, the predetermined value selected based on the n bits of an ending value of the second range of bits, and (iii) the third subset of characters is mapped to a third range of bits three times the size of the first range of bits; and storing the first, second, and third subset of encoded characters.

14. The computer-readable storage device of claim 13, wherein each character of the collection of characters is an American Standard Code for Information Interchange (ASCII character type).

15. The computer-readable storage device of claim 13, wherein determining a usage frequency further comprises collecting all character data from columns with data of a particular character type and identifying a predetermined number of most frequently used characters in the collected character data.

16. The computer-readable storage device of claim 13, wherein the computing device further performs operations, comprising encoding each character of the first subset of characters with one-third a number of bits used to encode each character of the third subset of characters.

* * * * *